US010027246B2

(12) United States Patent
Tokuyama et al.

(10) Patent No.: US 10,027,246 B2
(45) Date of Patent: Jul. 17, 2018

(54) POWER SEMICONDUCTOR MODULE AND ELECTRIC POWER CONVERSION DEVICE

(71) Applicant: Hitachi Automotive Systems, Ltd., Hitachinaka-shi, Ibaraki (JP)

(72) Inventors: Takeshi Tokuyama, Tokyo (JP); Takahiro Shimura, Hitachinaka (JP); Toshiya Satoh, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 15/555,444

(22) PCT Filed: Feb. 26, 2016

(86) PCT No.: PCT/JP2016/055737
§ 371 (c)(1),
(2) Date: Sep. 1, 2017

(87) PCT Pub. No.: WO2016/140147
PCT Pub. Date: Sep. 9, 2016

(65) Prior Publication Data
US 2018/0041136 A1    Feb. 8, 2018

(30) Foreign Application Priority Data

Mar. 5, 2015 (JP) ................. 2015-043093

(51) Int. Cl.
*H05K 3/28* (2006.01)
*H01L 23/34* (2006.01)
(Continued)

(52) U.S. Cl.
CPC ............ *H02M 7/42* (2013.01); *H01L 23/473* (2013.01); *H01L 25/07* (2013.01); *H01L 25/18* (2013.01); *H01L 2924/181* (2013.01)

(58) Field of Classification Search
CPC ...... H01L 23/34; H01L 23/3672; H01L 23/36; H01L 23/3677; H02M 7/003; H05K 3/28
See application file for complete search history.

(56) References Cited

U.S. PATENT DOCUMENTS 8,653,652 B2 * 2/2014 Tokuyama ............ H01L 25/072
257/722
2003/0213979 A1   11/2003 Nakajima et al.
2011/0299265 A1 * 12/2011 Nakatsu .................. B60L 11/14
361/820

FOREIGN PATENT DOCUMENTS

JP   2000-323630 A   11/2000
JP   2003-264265 A    9/2003
(Continued)

OTHER PUBLICATIONS

International Search Report (PCT/ISA/210) issued in PCT Application No. PCT/JP2016/055737 dated May 31, 2016 with English translation (five pages).
(Continued)

*Primary Examiner* — Gary L Laxton
(74) *Attorney, Agent, or Firm* — Crowell & Moring LLP

(57) ABSTRACT

An object of the present invention is to achieve both low height and miniaturization of a double side cooling type electric power conversion device. A power semiconductor module according to the present invention includes: a circuit body including a power semiconductor device and a terminal; and a case forming an accommodation space for accommodating the circuit body, wherein the case includes: a first heat radiation portion and a second heat radiation portion disposed to face each other sandwiching the accommodation space; a first opening that is disposed at a side portion to the first heat radiation portion and through which the terminal passes; a sealing surface formed to surround the first opening; and a reference surface disposed at a side portion to the (Continued)

second heat radiation portion, and the reference surface is formed on a surface opposite to a surface on which the sealing surface of the case is disposed such that, when projection is performed from a vertical direction of the reference surface, a projection of the reference surface and a projection of the sealing surface overlap each other.

8 Claims, 8 Drawing Sheets

(51) Int. Cl.
    *H02M 7/42*     (2006.01)
    *H01L 23/473*     (2006.01)
    *H01L 25/07*     (2006.01)
    *H01L 25/18*     (2006.01)

(56) References Cited

FOREIGN PATENT DOCUMENTS

| | | |
|---|---|---|
| JP | 2004-363295 A | 12/2004 |
| JP | 2005-57212 A | 3/2005 |
| JP | 2010-45399 A | 2/2010 |
| JP | 2010-219419 A | 9/2010 |

OTHER PUBLICATIONS

Japanese-language Written Opinion (PCT/ISA/237) issued in PCT Application No. PCT/JP2016/055737 dated May 31, 2016 (four pages).

* cited by examiner

POWER SEMICONDUCTOR MODULE AND ELECTRIC POWER CONVERSION DEVICE

TECHNICAL FIELD

The present invention relates to a power semiconductor module and an electric power conversion device for converting DC current to AC current, and in particular relates to an electric power conversion device for supplying AC current to a drive motor of a hybrid car or an electric car.

BACKGROUND ART

Mainly in a vehicle-mounted electric power conversion device, while capability of outputting a large current is required, miniaturization is also demanded. When the electric power conversion device outputs a large current, heat generated in a power semiconductor device incorporated in the power semiconductor module increases, and if a heat capacity of the power semiconductor module and the electric power conversion device is not increased, a heat resistant temperature of the power semiconductor device is reached and miniaturization is prevented. Therefore, a double side cooling type power semiconductor module that cools the power semiconductor device from both sides to improve cooling efficiency, and a double side cooling type electric power conversion device using the module, have been developed.

As an example of the electric power conversion device with such a structure, PTL 1 discloses a power module structure in which both main surfaces of the power semiconductor device configuring an arm of an inverter circuit are sandwiched between plate-like lead frames to configure the power module, and the module is incorporated in a heat radiation case for sealing and immersed in a water channel housing, and cooled from both sides.

CITATION LIST

Patent Literature

PTL 1: JP 2005-057212 A

SUMMARY OF INVENTION

Technical Problem

In recent years, a physical structure required for the electric power conversion device has also been diversified depending on a mounting position of the electric power conversion device on a vehicle, and a demand for low height has also been increased. The electric power conversion device according to PTL 1 has a problem that a sealing portion and a mounting portion around it prevent low height structuring and miniaturization. To achieve both low height and miniaturization of the electric power conversion device, a structure is required that reduces the height of a double side cooling power module capable of improving cooling performance of the power semiconductor device.

An object of the present invention is to achieve both low height and miniaturization of the double side cooling type electric power conversion device.

Solution to Problem

The power semiconductor module according to the present invention includes: a circuit body including a power semiconductor device and a terminal; and a case forming an accommodation space for accommodating the circuit body, wherein the case includes: a first heat radiation portion disposed to face the accommodation space; a second heat radiation portion disposed to face the first heat radiation portion sandwiching the accommodation space; a first opening that is disposed at a side portion to the first heat radiation portion and through which the terminal passes; a sealing surface formed to surround the first opening; and a reference surface disposed at a side portion to the second heat radiation portion, and the reference surface is formed on a surface opposite to a surface on which the sealing surface of the case is disposed such that, when projection is performed from a vertical direction of the reference surface, a projection of the reference surface and a projection of the sealing surface overlap each other.

Advantageous Effects of Invention

Both low height and miniaturization of the double side cooling type electric power conversion device can be both achieved.

DESCRIPTION OF EMBODIMENTS

An electric power conversion device according to the present invention will be described in detail below with reference to the drawings.

Example 1

An electric power conversion device according to the present embodiment can be applied to a hybrid car or a pure electric car. A vehicle drive inverter device converts DC power supplied from a vehicle-mounted battery or a vehicle-mounted generating device configuring a vehicle-mounted power supply to predetermined AC power, and supplies the obtained AC power to a vehicle drive motor to control drive of the vehicle drive motor. In addition, since the vehicle drive motor has also a function as a generator, the vehicle drive inverter device has also a function of converting AC power generated by the vehicle drive motor to DC power, depending on an operation mode. Incidentally, the configuration of the present embodiment is optimal as a vehicle drive electric power conversion device for a car or a truck, and can also be applied to other electric power conversion devices, for example, an electric power conversion device for a train, a ship, or an airplane, and further to an industrial electric power conversion device used as a control device for a motor for driving factory equipment, or to a household use electric power conversion device used for a control device for a motor for driving a household solar power generation system or a household appliance.

Figure 1:
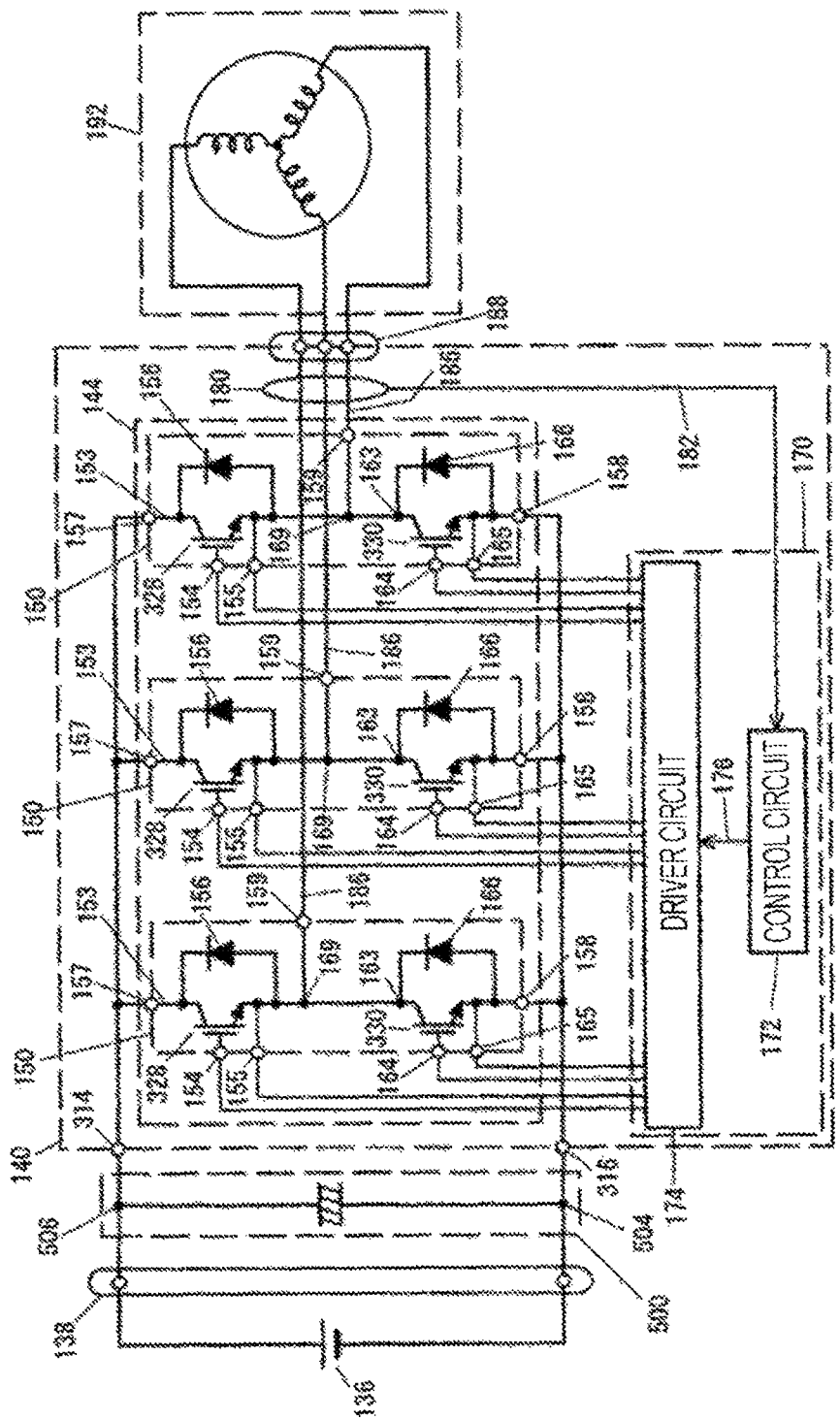
FIG. 1 is a circuit diagram of an inverter device.

An electric circuit configuration of an inverter device 140 will be described with reference to FIG. 1.

An inverter circuit 144 is provided with three upper and lower arms series circuits 150 each including an IGBT 328 and a diode 156 operating as an upper arm, and an IGBT 330 and a diode 166 operating as a lower arm, for three phases (U phase, V phase, W phase) corresponding to respective phase winding lines of armature winding lines of a motor generator 192. Each upper and lower arms series circuit 150 is connected to an AC power line (AC bus bar) 186 to the motor generator 192 through an AC terminal 159 and an AC connector 188 from a midpoint portion (intermediate electrode 169) of the circuit.

A collector electrode 153 of the IGBT 328 of the upper arm is electrically connected to an electrode of a capacitor in a positive electrode side of a capacitor module 500 via a positive electrode terminal (P terminal) 157, and an emitter electrode of the IGBT 330 of the lower arm is electrically connected to an electrode of the capacitor in a negative electrode side of the capacitor module 500 via a negative electrode terminal (N terminal) 158.

The IGBT 328 includes the collector electrode 153, a gate electrode 154, and an emitter electrode for signal 155. In addition, the IGBT 330 includes a collector electrode 163, a gate electrode 164, and an emitter electrode for signal 165. The diode 156 is electrically connected in parallel with the IGBT 328. In addition, the diode 166 is electrically connected in parallel with the IGBT 330. As a switching power semiconductor device, a metal oxide semiconductor field effect transistor (MOSFET) may be used, and in this case, the diode 156 and the diode 166 are not necessary. The capacitor module 500 is electrically connected to a positive electrode side capacitor terminal 506 and a negative electrode side capacitor terminal 504 via a DC connector 138. Incidentally, the inverter device 140 is connected to the positive electrode side capacitor terminal 506 via a DC positive electrode terminal 314, and connected to the negative electrode side capacitor terminal 504 via a DC negative electrode terminal 316.

Incidentally, the gate electrode 154 and the emitter electrode for signal 155 in FIG. 1 correspond to a signal connection terminal 327U in FIGS. 2(a) to 2(d) described later. The gate electrode 164 and the emitter electrode 165 in FIG. 1 correspond to a signal connection terminal 327L in FIGS. 2(a) to 2(d). The positive electrode terminal 157 in FIG. 1 is the same as a positive electrode side terminal 315D in FIGS. 2(a) to 2(d). The negative electrode terminal 158 in FIG. 1 is the same as a negative electrode side terminal 319D in FIGS. 2(a) to 2(d). The AC terminal 159 in FIG. 1 is the same as an AC terminal 320D in FIGS. 2(a) to 2(d).

Subsequently, an embodiment will be described of the power semiconductor module 300 according to the present embodiment and a double side cooling type electric power conversion device 299 using the module with reference to FIGS. 2(a) to 2(d), FIG. 3, and FIG. 4.

Figure 2A:
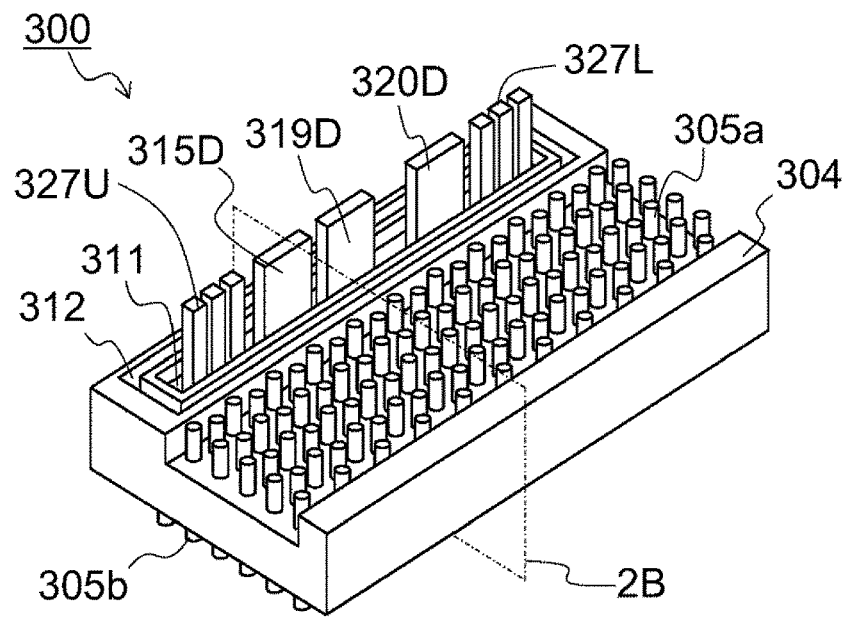
FIG. 2A is a perspective view of a power semiconductor module.
Figure 2B:
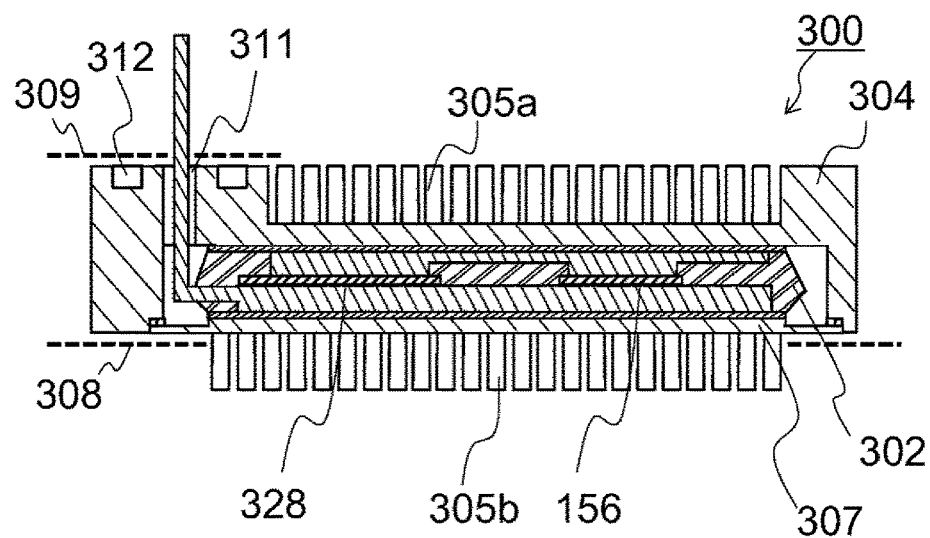
FIG. 2B is a sectional view of the power semiconductor module.
Figure 2C:
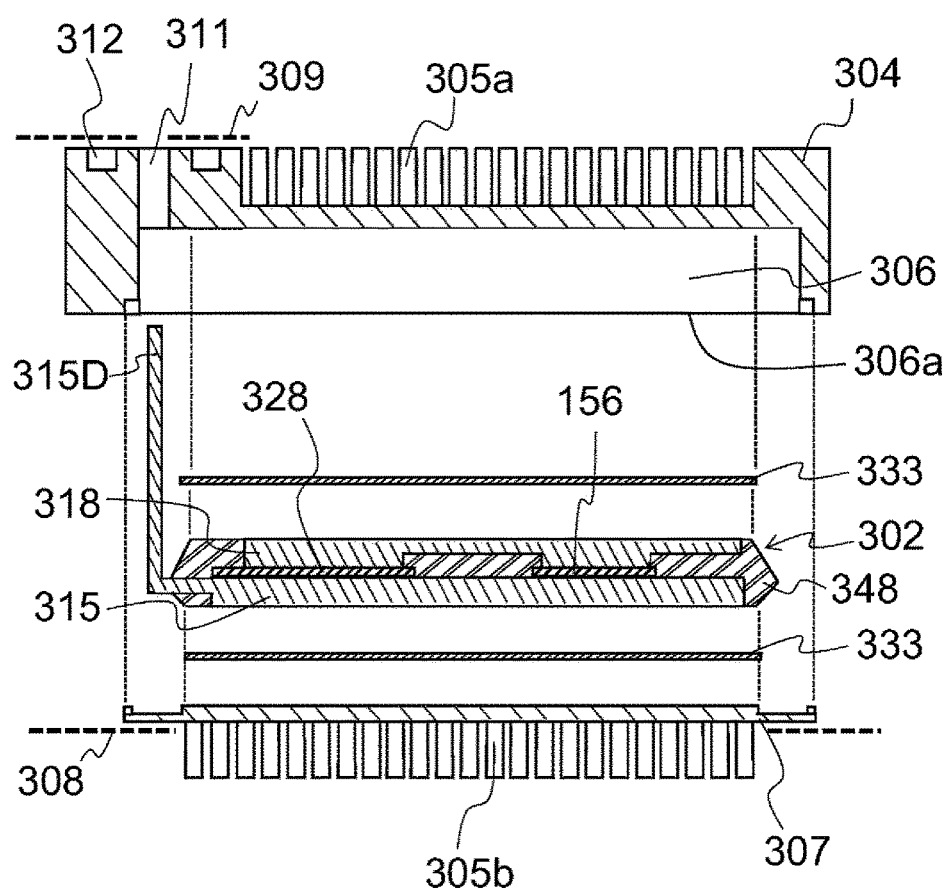
FIG. 2C is an exploded sectional view illustrating a process of assembling the power semiconductor module.
Figure 2D:
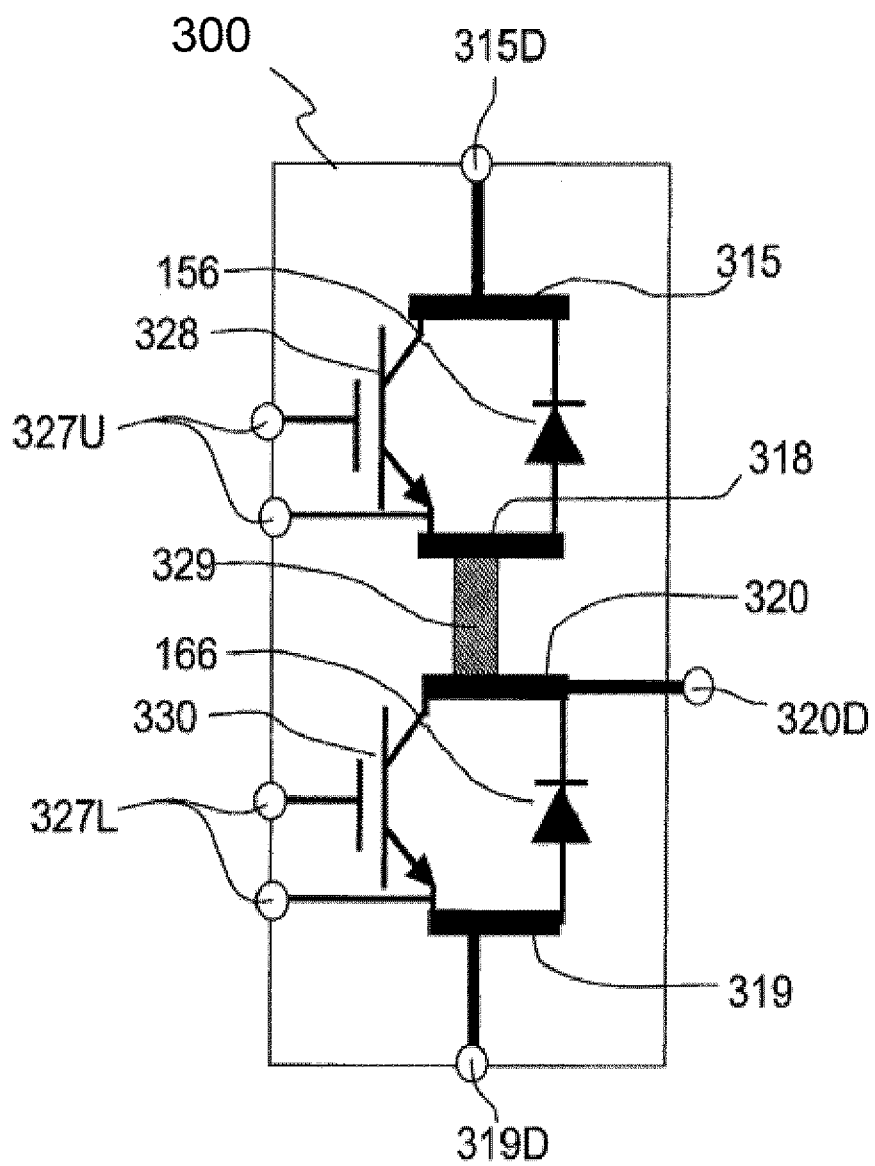
FIG. 2D is an equivalent circuit diagram illustrating a circuit incorporated in the power semiconductor module.

FIG. 2(a) is an exterior perspective view illustrating a schematic configuration of the power semiconductor module 300 according to the present embodiment. FIG. 2(b) is a sectional view in a cross section 2B of FIG. 2(a). FIG. 2(c) is an exploded sectional view illustrating a process of assembling the power semiconductor module 300. FIG. 2(d) is a circuit configuration diagram corresponding to FIG. 2(c).

The power semiconductor module 300 includes a circuit body 302 incorporating a power semiconductor device, a case frame 304, and a heat radiation base 307. The case frame 304 forms an accommodation space 306 for accommodating the circuit body 302, and an opening 306a connected to the accommodation space 306.

The case frame 304 includes a heat radiation portion 305a in which a fin is formed, on a surface opposite to a surface on which the opening 306a is formed. The fin heat radiation portion 305a is disposed to face the accommodation space 306. In addition, the case frame 304 includes a terminal through hole 311 formed at a side portion to the heat radiation portion 305a. The terminal through hole 311 is connected to the accommodation space 306, and allows a terminal of the circuit body 302 disposed in the accommodation space 306 to pass through. An O-ring groove 312 is formed around the terminal through hole 311. The O-ring groove 312 is formed on a sealing surface 309 formed to surround the terminal through hole 311.

The circuit body 302 is accommodated in the accommodation space 306 of the case frame 304, sandwiching an insulating member 333 between the circuit body 302 and the case frame 304. The circuit body 302 includes the IGBTs 328, 330, and the diodes 156, 166, as power semiconductor devices. These power semiconductor devices are provided at a position facing the heat radiation portion 305a, and subjected to heat radiation by a refrigerant flowing between the fins of the heat radiation portion 305a.

A conductor portion 315 is disposed on one surface side of the power semiconductor devices 328, 156, and a conductor portion 318 is disposed on the other surface side. A conductor portion 320 is disposed on one surface side of the power semiconductor devices 330, 166, and a conductor portion 319 is disposed on the other surface side. The IGBT 328 and the diode 156 configuring an upper arm circuit are metal-bonded to be sandwiched in parallel by the conductor portion 315 and 318. The IGBT 330 and the diode 166 configuring a lower arm circuit are metal-bonded to be sandwiched in parallel by the conductor portion 320 and 319.

The power semiconductor devices 328, 330, 156, 166 and the conductor portions 315, 318, 319, 320 are sealed with resin sealing material 348. Portions of the conductor portions 315, 320, 319 protrude from the resin sealing material 348, and respectively form the positive electrode side terminal 315D, the AC terminal 320D, the negative electrode side terminal 319D. In addition, the signal connection terminals 327U, 327L also protrude from the resin sealing material 348. These terminals are formed to protrude from the resin sealing material 348, and further to bend at a substantially right angle. Tips of the bent terminals pass through the terminal through hole 311 and extend to the outside of the case frame 304.

In a state in which the circuit body 302 is accommodated in the accommodation space 306, the opening 306a of the case frame 304 is closed by the heat radiation base 307. On the heat radiation base 307, in a region facing the power semiconductor device, a heat radiation portion 305b including a fin is formed. Between the heat radiation base 307 and the circuit body 302, the insulating member 333 is disposed. The heat radiation base 307 is bonded to the case frame 304 with metal bonding or the like. Thus, an opening 306a side of the accommodation space 306 is sealed. The heat radiation base 307 functions as a lid closing the opening 306a of the case frame 304, and also functions as a heat radiation portion for transmitting heat generation of the power semiconductor device to the refrigerant.

In a state in which the heat radiation base 307 is bonded to the case frame 304, a reference surface 308 is formed at a side portion to the heat radiation portion 305b. The reference surface 308 is a flat surface formed on a surface on one side of the case frame 304. The reference surface 308 is provided substantially in parallel with the sealing surface 309. The reference surface 308 is formed such that, when projection is performed from a direction vertical to the in-plane direction of the reference surface 308, a projection of the reference surface 308 and a projection of the sealing surface 309 overlap each other. The reference surface 308 and the sealing surface 309 are disposed to face each other on both sides with respect to the case frame 304. In this way, the reference surface 308 and the sealing surface 309 overlap each other in the vertical direction, whereby the reference surface 308 functions as a surface that receives a load to press an O-ring disposed in the O-ring groove 312.

In addition, in the present example, a bonding portion between the heat radiation base 307 and the case frame 304 is provided in the reference surface 308 overlapping with the sealing surface 309 in the vertical direction. For that reason, the sealing surface 309 functions as a surface that receives a bonding load of when the heat radiation base 307 is bonded to the case frame 304. The sealing surface 309 is formed with high rigidity, to hold a sealing member by a member such as a lid 313 described later with the O-ring groove 312. Therefore, the sealing surface 309 can firmly support the load during bonding of the heat radiation base 307.

In addition, since a portion interfering with a bonding tool is not provided near a bonding portion and the reference surface 308 is flat, bonding work can be easily performed also during work of bonding the heat radiation base 307 and the case frame 304 together by using a bonding tool. In addition, since there is no need to provide an excessive space to avoid interference with the bonding tool, area saving and miniaturization of the entire power semiconductor module can be achieved.

In the heat radiation base 307, the thickness of the member can be changed between a region where the fin 305b is formed and a region near the bonding portion to the case frame 304 formed around the fin 305b region. For example, the thickness of the heat radiation base in the region near the bonding portion to the case frame 304 is made thinner than the thickness of the heat radiation base in the region where the fin 305b is formed, whereby heat radiation, manufacturing assemblability, and reliability can be improved.

The fins 305a and 305b are each formed from a member having electric conductivity, for example, Cu, Cu alloy, a composite material such as Cu—C, Cu—CuO, or Al, Al alloy, a composite material such as AlSiC, Al—C.

As a sealing resin material 348 to be used for the circuit body 302, for example, resin can be used based on a novolac-based, a polyfunctional-based, a biphenyl-based epoxy resin system. The sealing resin material 348 can contain ceramics such as SiO2, Al2O3, AlN, and BN, gel, and rubber, so that the coefficient of thermal expansion can be brought closer to that of the conductor portion. Thus, a difference in the coefficient of thermal expansion between members can be reduced, and thermal stress generated by temperature rise during use is significantly reduced, so that a lifetime of the power semiconductor module can be extended.

As a metal bonding agent for bonding the power semiconductor device and the conductor portion together, it is possible to use, for example, a Sn alloy-based soft soldering material (solder), a hard soldering material such as Al alloy or Cu alloy, or a metal sintered material using metal nanoparticles or metal microparticles.

Figure 3:
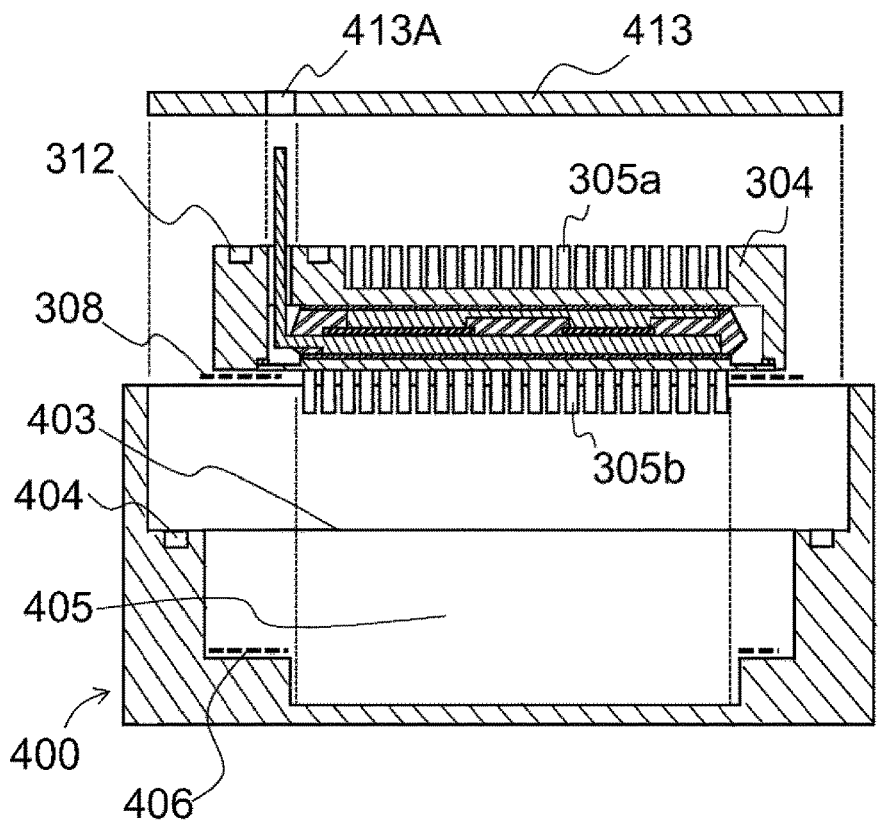
FIG. 3 is an exploded sectional view illustrating a process of assembling the power semiconductor module to a flow path forming body.

FIG. 3 is an exploded sectional view illustrating a process of assembling the power semiconductor module 300 to a flow path forming body 400. The flow path forming body 400 includes a flow path space 405, and a flow path opening 403 connected to the flow path space 405. The power semiconductor module 300 passes through the flow path opening 403, and is accommodated in the flow path space 405.

In the flow path forming body 400, a module receiving surface 406 is formed in the flow path space 405. The module receiving surface 406 is in contact with the reference surface 308 of the power semiconductor module 300. In addition, the flow path forming body 400 forms a space that is recessed toward the bottom side from the module receiving surface 406 and in which the fin 305b is disposed. The module receiving surface 406 is formed up to the vicinity of the fin 305b forming region, whereby the flow path forming body 400 can suppress a bypass flow of the refrigerant flowing between the fins 305b of the power semiconductor module 300. For that reason, the structure of the flow path space 405 of the flow path forming body 400 is preferably designed along the shape of in particular the fin 305b of the power semiconductor module 300.

In a state in which the power semiconductor module 300 is accommodated, the flow path opening 403 is closed by a lid 413. The lid 413 seals the flow path space 405 by an O-ring disposed in an O-ring groove 404 formed on the flow path forming body 400. The lid 413 is disposed at a side on which the sealing surface 309 and the heat radiation portion 305a are formed, with respect to the power semiconductor module 300. Between the fins formed in the heat radiation portion 305a, and in a space surrounded by the lid 413, the refrigerant is circulated, similarly to the heat radiation portion 305b side.

In the lid 413, a terminal opening 413A is formed. The terminal of the power semiconductor module 300 passes through the terminal opening 413A. The lid 413 presses the power semiconductor module 300 to the flow path forming body 400 side, sandwiching the O-ring disposed in the O-ring groove 312. Being sealed by the O-ring sandwiched between the lid 413 and the O-ring groove 312, the refrigerant flowing in a region of the heat radiation portion 305a does not leak into the power semiconductor module 300 from the terminal through hole 311.

The power semiconductor module 300 pressed by the lid 413 is supported by the module receiving surface 406 of the flow path forming body 406. In this way, the power semiconductor module 300 is pressed and fixed in a form of being sandwiched between the flow path forming body 400 and the lid 413. According to the configuration of the power semiconductor module of the present embodiment, it is possible to simultaneously realize a sealing structure in the lid 413 side and a fixed disposition structure on a contact surface between the reference surface 308 and the module receiving surface 406. Therefore, physical structure miniaturization of the entire electric power conversion device can be achieved.

Figure 4:
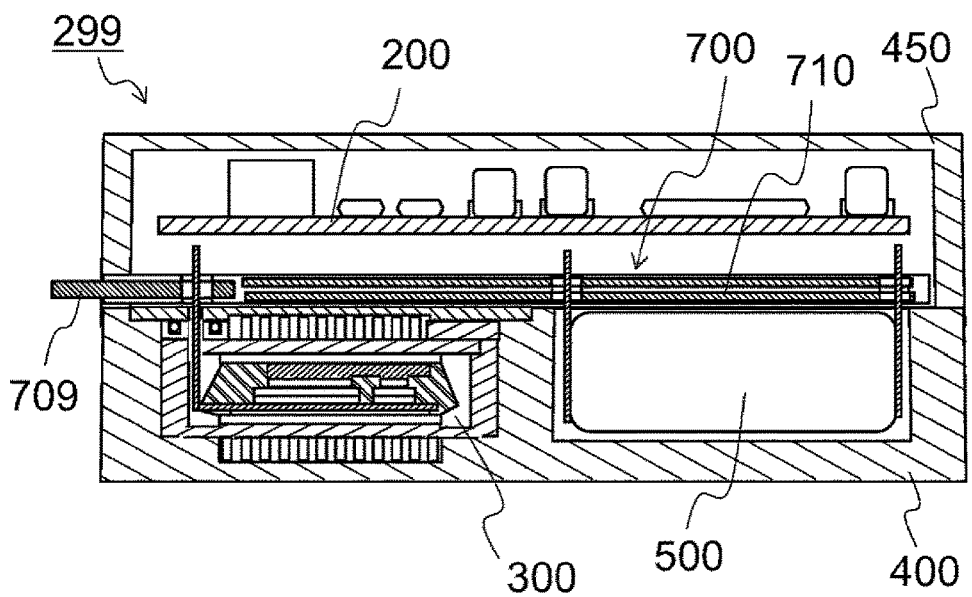
FIG. 4 is a sectional view illustrating an electric power conversion device of a present embodiment structure.

FIG. 4 is a sectional view illustrating a configuration example of the electric power conversion device 299 to which a flow path structure of FIG. 3 is applied. The electric power conversion device 299 includes the flow path forming body 400 that is a housing integrally formed with a cooling flow path, a mold bus bar 700, the power semiconductor module 300, the capacitor module 500, and a control board 200. The flow path forming body 400 also serving as the housing includes an opening into which the power semiconductor module 300 is inserted, and an opening into which the capacitor module 500 is inserted.

In the mold bus bar 700, a DC bus bar 710 and an AC bus bar 709 are sealed with a resin material having insulating properties. The DC bus bar 710 electrically connects the capacitor module 500 and the power semiconductor module 300 together. The DC bus bar 710 has a structure in which a positive electrode side bus bar and a negative electrode side bus bar are layered. Currents respectively having polarities opposite to each other flow through the positive and negative electrode bus bars, and low inductance is achieved due to magnetic field cancellation effect.

The mold bus bar 700 is disposed to face the power semiconductor module 300 sandwiching the lid 413. The mold bus bar 700 is disposed on the same side with respect to the capacitor module 500 and the power semiconductor module 300.

The electric power conversion device of the present embodiment is capable of simultaneously cooling the power semiconductor module 300 and the capacitor module 500 with the flow path forming body 400 also serving as the housing. In addition, by installing the mold bus bar 700 directly to the flow path forming body 400, it is also possible to cool the mold bus bar 700. In addition, the power semiconductor module 300 and the capacitor module 500 are disposed on the same layer, so that low height of the electric power conversion device can be achieved.

Example 2

A power semiconductor module 300 and an electric power conversion device 299 in Example 2 will be described with reference to FIGS. 5(a) to 5(c). Common components are denoted by the same reference numerals as those of Example 1, and detailed descriptions thereof will be omitted.

Figure 5A:
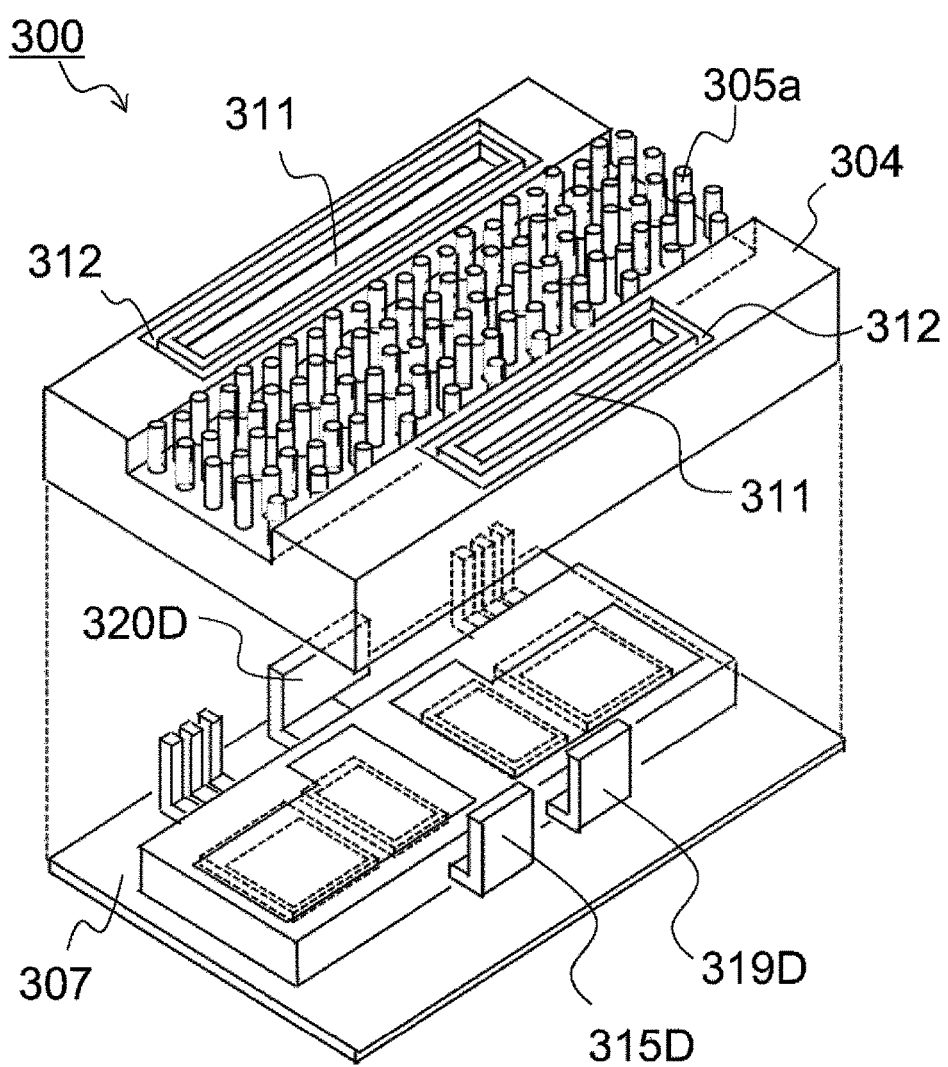
FIG. 5A is a sectional view of a power semiconductor module 300 of Example 2.
Figure 5B:
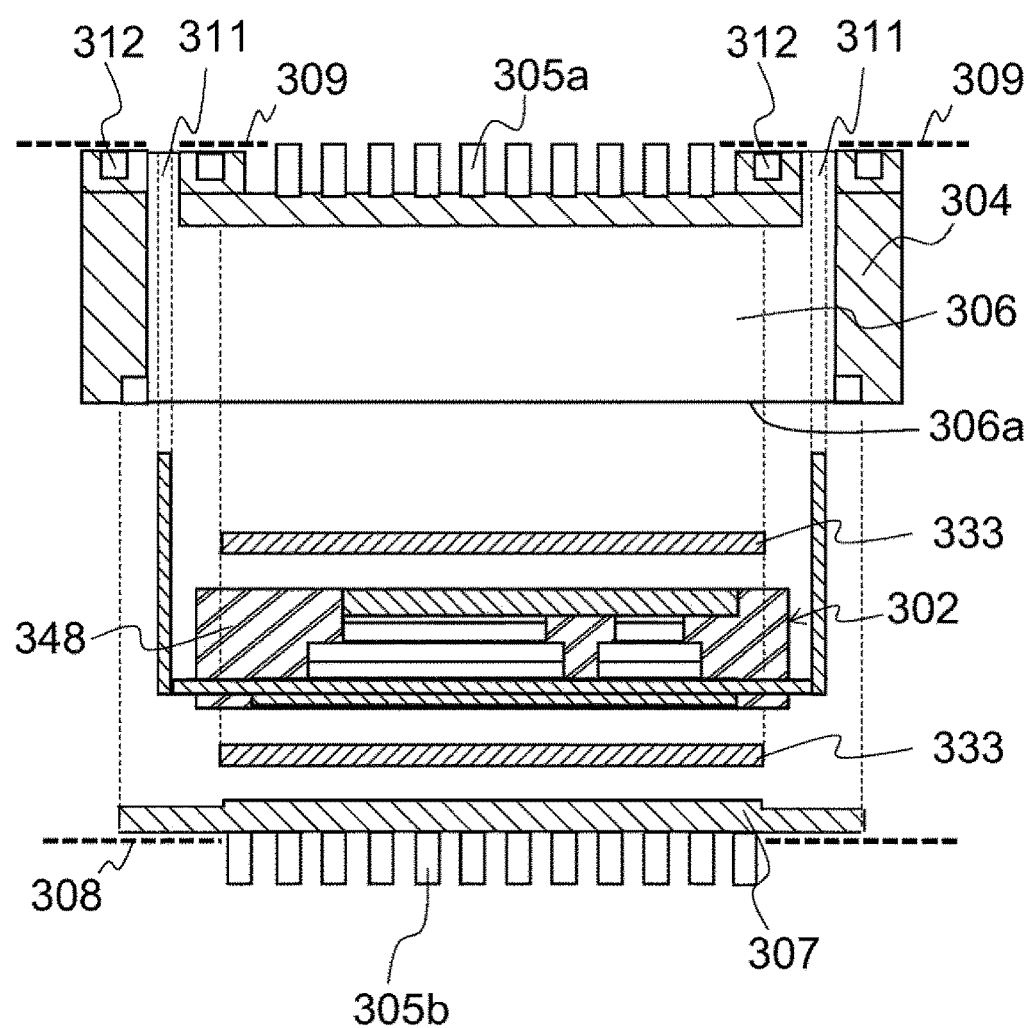
FIG. 5B is an exploded perspective view illustrating a process of assembling the power semiconductor module 300 of Example 2.
Figure 5C:
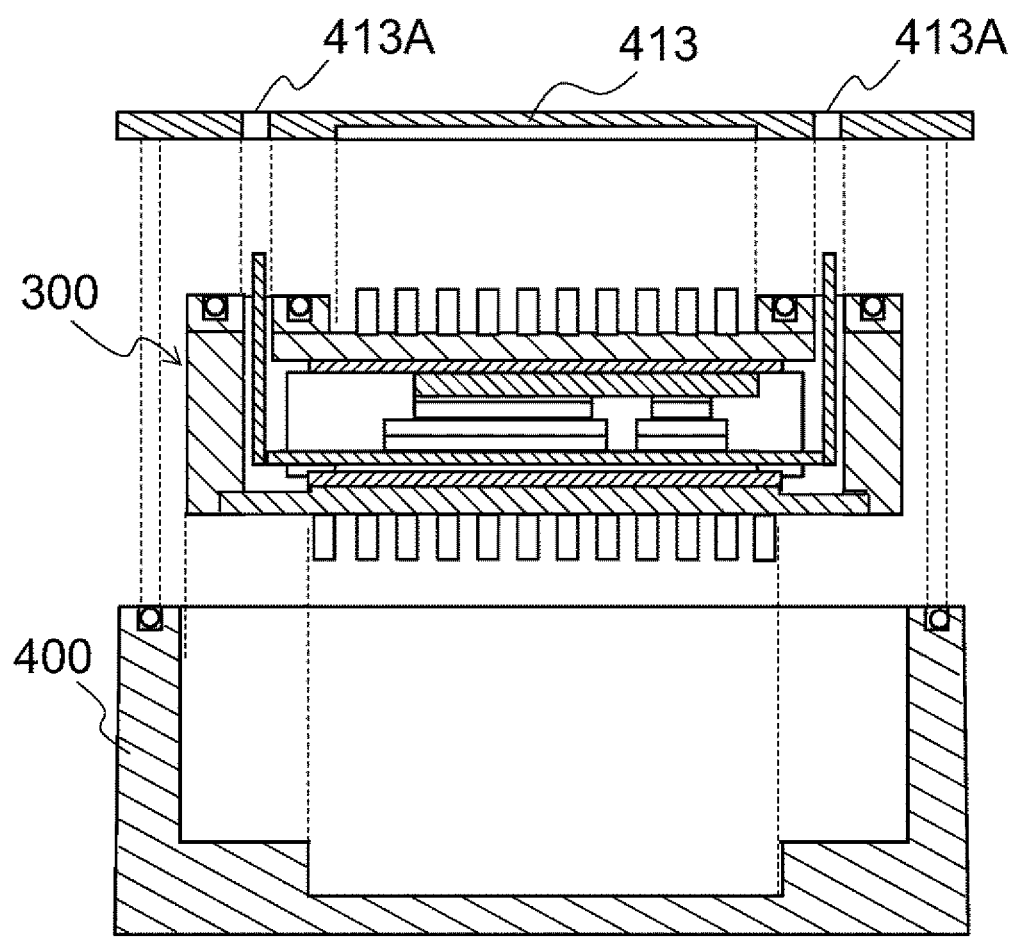
FIG. 5C is an exploded sectional view illustrating a process of assembling the power semiconductor module 300 of Example 2 to a water channel housing.

FIG. 5(a) is an exploded perspective view of the power semiconductor module 300. FIG. 5(b) is an exploded sectional view. FIG. 5(c) is a sectional view illustrating a process of assembling to a flow path forming body 400. A difference from the structure described in Example 1 is that Example 2 has a structure in which two terminal through holes 311 are provided in a case frame 304, and module terminals protrude from both sides sandwiching a heat radiation portion 305a.

As illustrated in FIG. 5(a), a positive electrode side terminal 315D and a negative electrode side terminal 319D through which DC current flows protrude from one side of the power semiconductor module 300, and an AC terminal 320D through which AC current flows protrudes from the other side. For example, the positive electrode side terminal 315D and the negative electrode side terminal 319D are disposed on a side on which a capacitor module 500 is disposed with respect to the power semiconductor module 300, whereby reduction of wiring inductance can be achieved.

In addition, the two terminal through holes 311 are provided, so that two O-ring grooves 312 are formed. Further, two terminal openings 413A are formed of a lid 413. Sealing surfaces 309 are respectively formed at both sides to the heat radiation portion 305a.

In addition, in the lid 413 used in the present example, corresponding to a protruding length of a fin 305a, a recess portion is formed on the fin 305a side. By designing the recess portion to match the shape of the fin 305a, a bypass flow flowing through the fin tip and a fin side portion can be suppressed. Thus, cooling performance is improved, and miniaturization of the power semiconductor module can be achieved.

According to the power semiconductor module of the present example and the electric power conversion device using the power semiconductor module, due to a structure to output the power module terminal from both sides of the heat radiation portion, a degree of freedom can be improved of the dimension of the terminal through hole and disposition of the power module terminal. Thus, effects can be achieved, such as miniaturization and low height of the entire electric power conversion device, reduction of wiring inductance, suppression of magnetic coupling between a signal terminal and a DC terminal.

REFERENCE SIGNS LIST

138 DC connector
140 inverter device
144 inverter circuit
150 upper and lower arms series circuit
153 collector electrode
154 gate electrode
155 emitter electrode for signal
156 diode (upper arm)
157 positive electrode terminal (P terminal)
158 negative electrode terminal (N terminal)
159 AC terminal
163 collector electrode
164 gate electrode
165 emitter electrode for signal
166 diode (lower arm)
169 intermediate electrode
186 AC power line (AC bus bar)
188 AC connector
192 motor generator
200 control board
300 power semiconductor module
302 circuit body
304 case frame
305a heat radiation portion (fin)
305b heat radiation portion (fin)
306 accommodation space
307 heat radiation base
308 reference surface
309 sealing surface
311 terminal through hole (first opening)
312 O-ring groove
314 DC positive electrode terminal
315 conductor portion
315D positive electrode side terminal
316 DC negative electrode terminal
318 conductor portion
319 conductor portion
319D negative electrode side terminal
320 conductor portion
320D AC terminal
327L signal connection terminal
327U signal connection terminal
328 IGBT (upper arm)

330 IGBT (lower arm)
333 insulating material
348 resin sealing material
400 flow path forming body
403 flow path opening
404 ring groove
405 flow path space
406 module receiving surface
413 lid
413A terminal opening
450 housing lid
500 capacitor module
504 negative electrode side capacitor terminal
506 positive electrode side capacitor terminal
700 mold bus bar
709 AC bus bar
710 DC bus bar

The invention claimed is:

1. A power semiconductor module comprising:
a circuit body including a power semiconductor device and a terminal; and
a case forming an accommodation space for accommodating the circuit body, wherein
the case includes: a first heat radiation portion disposed to face the accommodation space; a second heat radiation portion disposed to face the first heat radiation portion sandwiching the accommodation space; a first opening that is disposed at a side portion to the first heat radiation portion and through which the terminal passes; a sealing surface formed to surround the first opening; and a reference surface disposed at a side portion to the second heat radiation portion, and
the reference surface is formed on a surface opposite to a surface on which the sealing surface of the case is disposed such that, when projection is performed from a vertical direction of the reference surface, a projection of the reference surface and a projection of the sealing surface overlap each other.

2. The power semiconductor module according to claim 1, wherein
the case includes a case frame including an opening, and a heat radiation base made of metal,
the opening of the case frame is closed by the heat radiation base,
the heat radiation base forms the second heat radiation portion of the case, and
a bonding portion between the case frame and the heat radiation base is formed on the reference surface.

3. An electric power conversion device comprising:
the power semiconductor module according to claim 1;
a flow path forming body forming a flow path space through which a refrigerant flows, and a flow path opening connected to the flow path space; and
a lid closing the flow path opening, wherein
the power semiconductor module is disposed in the flow path space,
the lid closes the flow path opening to cover the sealing surface and the first heat radiation portion, and
the flow path forming body includes a receiving surface being in contact with the reference surface of the power semiconductor module.

4. A power semiconductor module that is the electric power conversion device according to claim 3, wherein
the terminal includes a DC terminal for transmitting DC, and an AC terminal for transmitting AC, and
the DC terminal and the AC terminal pass through the first opening.

5. The power semiconductor module according to claim 4, wherein
the terminal includes the DC terminal for transmitting DC, and the AC terminal for transmitting AC,
the case includes a second opening disposed at an opposite side to the first opening sandwiching the first heat radiation portion,
the DC terminal passes through the first opening, and
the DC terminal passes through the second opening.

6. An electric power conversion device comprising:
the power semiconductor module according to any one of claim 2;
a flow path forming body forming a flow path space through which a refrigerant flows, and a flow path opening connected to the flow path space; and
a lid closing the flow path opening, wherein
the power semiconductor module is disposed in the flow path space,
the lid closes the flow path opening to cover the sealing surface and the first heat radiation portion, and
the flow path forming body includes a receiving surface being in contact with the reference surface of the power semiconductor module.

7. A power semiconductor module that is the electric power conversion device according to claim 6, wherein
the terminal includes a DC terminal for transmitting DC, and an AC terminal for transmitting AC, and
the DC terminal and the AC terminal pass through the first opening.

8. The power semiconductor module according to claim 7, wherein
the terminal includes the DC terminal for transmitting DC, and the AC terminal for transmitting AC,
the case includes a second opening disposed at an opposite side to the first opening sandwiching the first heat radiation portion,
the DC terminal passes through the first opening, and
the DC terminal passes through the second opening.

* * * * *